(12) United States Patent
Kim

(10) Patent No.: US 8,664,113 B2
(45) Date of Patent: Mar. 4, 2014

(54) MULTILAYER INTERCONNECT STRUCTURE AND METHOD FOR INTEGRATED CIRCUITS

(75) Inventor: Ryoung-Han Kim, Clifton Park, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 114 days.

(21) Appl. No.: 13/096,898

(22) Filed: Apr. 28, 2011

(65) Prior Publication Data
US 2012/0273958 A1 Nov. 1, 2012

(51) Int. Cl.
*H01L 21/4763* (2006.01)
(52) U.S. Cl.
USPC ............. 438/637; 438/11; 438/618; 438/622; 257/48; 257/700; 257/758; 257/E23.145
(58) Field of Classification Search
USPC ............ 257/48, 700, 751, 758, 774, E23.145; 438/11, 618, 622, 626–629, 637, 672
See application file for complete search history.

(56) References Cited

U.S. PATENT DOCUMENTS

| | | | |
|---|---|---|---|
| 5,891,799 | A | 4/1999 | Tsui |
| 6,225,211 | B1 | 5/2001 | Tsui |
| 7,452,821 | B2 | 11/2008 | Gruening-Von Schwerin et al. |
| 2004/0113279 | A1 | 6/2004 | Chen et al. |
| 2006/0118962 | A1 | 6/2006 | Huang et al. |
| 2007/0077761 | A1 | 4/2007 | Lehr et al. |
| 2008/0012142 | A1 | 1/2008 | Mehta et al. |
| 2009/0057899 | A1 | 3/2009 | Cheon et al. |
| 2011/0100697 | A1* | 5/2011 | Yang et al. ..................... 174/262 |
| 2011/0272818 | A1* | 11/2011 | Jeong ............................. 257/774 |

FOREIGN PATENT DOCUMENTS

DE 10127888 A1 12/2002
DE 102005046975 A1 4/2007

OTHER PUBLICATIONS

Wolf, Stanley, "15.4 Introduction to Dual-Damascene Interconnect Processes"; Silicon Processing for the VLSI ERA, vol. 4, p. 674-679; 2004.
Office Action issue Jul. 31, 2013 in German Patent Application No. 10 2012 207 116.4.

* cited by examiner

*Primary Examiner* — Mark A Laurenzi
(74) *Attorney, Agent, or Firm* — Ingrassia Fisher & Lorenz, P.C.

(57) ABSTRACT

A multilayer interconnect structure is formed by, providing a substrate having thereon a first dielectric for supporting a multi-layer interconnection having lower conductor $M_N$, upper conductor $M_{N+1}$, dielectric interlayer (DIL) and interconnecting via conductor $V_{N+1/N}$. The lower conductor $M_N$ has a first upper surface located in a recess below a second upper surface of the first dielectric. The DIL is formed above the first and second surfaces. A cavity is etched through the DIL from a desired location of the upper conductor $M_{N+1}$, exposing the first surface. The cavity is filled with a further electrical conductor to form the upper conductor $M_{N+1}$ and the connecting via conductor $V_{N+1/N}$ making electrical contact with the first upper surface. A critical dimension between others of lower conductors $M_N$ and the via conductor $V_{N+1/N}$ is lengthened. Leakage current and electro-migration therebetween are reduced.

12 Claims, 9 Drawing Sheets

510  610

511  611

39
516  616

39
517  617

MULTILAYER INTERCONNECT STRUCTURE AND METHOD FOR INTEGRATED CIRCUITS

FIELD OF THE INVENTION

This invention relates generally to structures and methods for forming multi-layer interconnect structures and integrated circuits containing them.

BACKGROUND OF THE INVENTION

It is common to employ multiple layers of interconnections as a part of complex integrated circuits (ICs). As used herein, the term "integrated circuit" and the abbreviation "IC", singular or plural, are intended to include any electronic system employing monolithic multi-layer interconnections whether formed on a semiconductor substrate or not. Generally, each level of the multi-layered interconnections consists of a first level of electrical conductors, e.g., identified as conductors $M_N$, covered by a dielectric interlayer above which is a second level of conductors, e.g., identified as conductors $M_{N+1}$, with various conductor filled vias, e.g., identified as $V_{N+1/N}$, extending between the two conductor levels $M_{N+1}$ and $M_N$, thereby electrically coupling some of the conductors $M_{N+1}$ to some of conductors $M_N$ that lie one above the other. The index N identifies the particular interconnection level in the stack of interconnection levels being referred to. As the feature sizes of the various devices and other elements within the IC are shrunk in order to achieve every more complex IC functions, packing density limitations that may be imposed by the multilayer interconnections and failure mechanisms that may arise therefrom are of greater concern.

BRIEF SUMMARY OF THE INVENTION

A method for forming an integrated circuit (IC) containing a multi-layer interconnect structure is disclosed. A substrate is provided having thereon an $N^{th}$ dielectric, in or on which it is desired to form a multi-layer interconnection having lower conductor $M_N$, upper conductor $M_{N+1}$ and interconnecting via $V_{N+1/N}$. A lower conductor $M_N$ is formed on the substrate with an upper surface of the lower conductor $M_N$ recessed below an upper surface of the $N^{th}$ dielectric. An $(N+1)^{th}$ dielectric is provided above the $N^{th}$ dielectric and the upper surface of the lower conductor $M_N$. An $(N+1)^{th}$ cavity is formed through the $(N+1)^{th}$ dielectric from a desired location of the upper conductor $M_{N+1}$ and exposing the upper surface of the lower conductor $M_N$. The $(N+1)^{th}$ cavity is filled with an electrical conductor adapted to form the upper conductor $M_{N+1}$ and the connecting via $V_{N+1/N}$, and make electrical contact with the upper surface of the lower conductor $M_N$.

In a preferred embodiment, forming the lower conductor $M_N$ includes, forming at least an $N^{th}$ dielectric on the substrate, etching an $N^{th}$ cavity at least through the $N^{th}$ dielectric, corresponding to the desired location of the lower conductor $M_N$, filling the $N^{th}$ cavity with electrically conductive material adapted to serve as the lower conductor $M_N$, and removing conductive material in the $N^{th}$ cavity to lower an upper surface of the lower conductor $M_N$ below an upper surface of the $N^{th}$ dielectric within a recess portion of the $N^{th}$ dielectric around the $N^{th}$ cavity.

Where a stack of multi-layer interconnections is being formed in the IC it is also desirable to remove conductor material in the $(N+1)^{th}$ cavity to lower an upper surface of the upper conductor $M_{N+1}$ below an upper surface of the $(N+1)^{th}$ dielectric and then incrementing N by one and repeating providing, etching, filling, querying, and removing for any or all desired successive interconnection level N up to $N=Q-1$.

An integrated circuit (IC) is provided, having, one or more first level conductors $M_N$, one or more second level conductors $M_{N+1}$ and at least one via conductor $V_{N+1/N}$ coupling at least one second level conductor $M_{N+1}$ to at least one first level conductor $M_N$ and wherein an upper portion of the at least one via conductor $V_{N+1/N}$ is self-aligned with the at least one second level conductor $M_{N+1}$ and a lower portion of the at least one via conductor $V_{N+1/N}$ is self-aligned with the at least one first level conductor $M_N$. In a preferred embodiment, there is a lateral step in the at least one via conductor $V_{N+1/N}$ where the upper portion and lower portion meet. In a further embodiment, the first level conductor $M_N$ includes at least first and second conductors $M_N$ separated by a first lateral distance and wherein the first of the at least two conductors $M_N$ connects to the at least one via conductor $V_{N+1/N}$ and the lateral step in the at least one via conductor $V_{N+1/N}$ is separated from the second of the at least two conductors $M_N$ by a distance larger than if the second of the at least two conductors $M_N$ extended to the same level as the lateral step.

A method is provided for forming a multi-layer interconnection, including, providing a substrate having thereon a first dielectric for supporting the multi-layer interconnection, wherein the multi-layer interconnection has a lower conductor $M_N$, upper conductor $M_N$ q, an interlayer dielectric and interconnecting via conductor $V_{N+1/N}$, wherein the lower conductor $M_N$ has a first upper surface located in a recess below a second upper surface of the first dielectric, forming the interlayer dielectric above the first and second surfaces, etching a cavity through the interlayer dielectric from a desired location of the upper conductor $M_{N+1}$ and exposing the first surface in the recess, and filling the cavity with an electrical conductor to form the upper conductor $M_{N+1}$ and the connecting via conductor $V_{N+1/N}$ making electrical contact between a first of upper conductor $M_{N+1}$ and the first upper surface in the recess.

BRIEF DESCRIPTION OF THE DRAWINGS

The invention will be better understood from a reading of the following detailed description, taken in conjunction with the accompanying figures in the drawings in which like numerals denote like or analogous elements, and wherein.

DETAILED DESCRIPTION OF THE INVENTION

The drawings and associated discussion illustrate a two-level conductor-insulator-conductor sandwich (e.g., upper conductors $M_{N+1}$–($N^{th}$ dielectric interlayer)–lower conductors $M_N$) for an integrated circuit (IC) in which some of conductors $M_{N+1}$ are coupled to some of conductors $M_N$ by one or more electrically conductive vias $V_{N+1/N}$ passing through the $N^{th}$ dielectric interlayer. The letter N is used as an index identifying a particular interconnection level in a stack of such interconnection levels in the IC. Such two-level conductor-insulator-conductor sandwich may be stacked multiple times (e.g., for N=1, 2, 3, . . . ) to provide a multi-layered interconnection system of however many interconnection levels are needed to achieve the desired interconnection complexity for the IC. For convenience of description, the conductors $M_{N+1}$ and $M_N$ may be referred to as "metals", but it should be understood that the words "metal" and "conductor", singular or plural, are used interchangeably herein to include any type of electrical conductor, whether metallic or not. Semiconductors, doped semiconductors, metals, semimetals, metal alloys, semiconductor-metal alloys and combinations thereof are non-limiting examples of such electrical conductors. The terms "dielectric", "insulator" and "insulating" are used interchangeably herein to describe materials whose electrical conductivity is sufficiently low so as to have no adverse impact on the operation of the structures, devices and circuits described herein.

Figure 1:
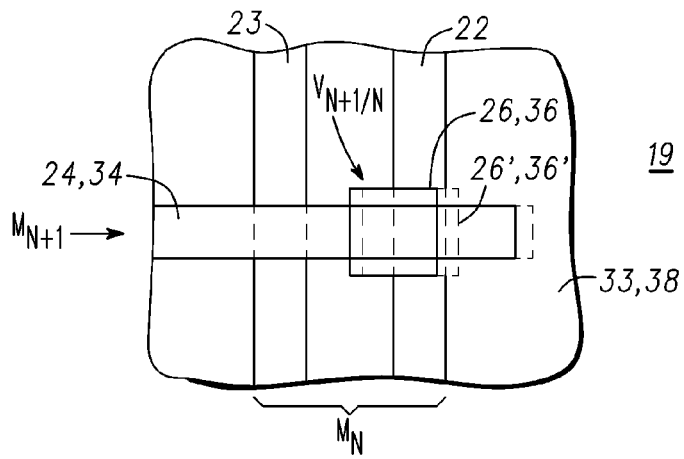
FIG. 1 shows a simplified plan view of a two-level interconnection for an integrated circuit, where $M_{N+1}$ and $M_N$ are approximately orthogonal.

FIG. 1 shows a simplified plan view of two-level interconnection 19, 39 where $M_{N+1}$ and $M_N$ are approximately orthogonal. Two-level interconnection 19 includes $M_N$ conductors 22, 23 and $M_{N+1}$ conductor 24, separated in a direction normal to the plane of FIG. 1 by interlayer dielectric 33, and $M_N$ conductor 22 is electrically coupled to $M_{N+1}$ conductor 24, by via conductor $V_{N+1/N}$ 26 or 26' shown in cross-section in FIG. 2. Two-level interconnection 39 includes $M_N$ conductors 22, 23 and $M_{N+1}$ conductor 34, separated in a direction normal to the plane of FIG. 1 by interlayer dielectric 38, and $M_N$ conductor 22 is electrically coupled to $M_{N+1}$ conductor 34, by via conductor $V_{N+1/N}$ 36 or 36' shown in cross-section of FIG. 3. For convenience of illustration, via conductor $V_{N+1/N}$ 26, 36 in FIG. 1 is shown as a solid line even though it underlies $M_{NA}$ conductor 24, 34. The solid line of via conductor $V_{N+1/N}$ 26, 36 in FIG. 1 (and in FIGS. 2-3) illustrate the situation when $V_{N+1/N}$ is laterally (e.g., left-right) somewhat misaligned relative to $M_N$ conductor 22, and the dashed lines of via conductor $V_{N+1/N}$ 26', 36' illustrates the situation when $V_{N+1/N}$ is nominally laterally (e.g., left-right) aligned with $M_N$ conductor 22.

Figure 2:
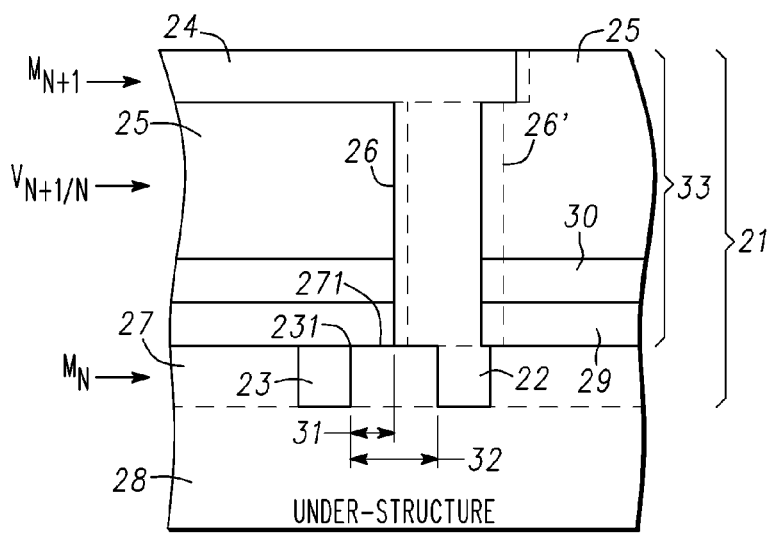
FIG. 2 shows a simplified cross-sectional view of the two-level interconnection of FIG. 1 according to the prior art, illustrating an adverse effect of via alignment variation.

FIG. 2 shows a simplified cross-sectional view of two-level interconnection 19 of FIG. 1, according to the prior art, illustrating an adverse effect of lateral (e.g., left-right) alignment spacing variation of $M_N$ conductor 22 to $V_{N+1/N}$ conductor 26 or vice-versa. Two-level interconnection 19 includes composite layer 21 resting on under-structure 28. Interlayer dielectric 33 made up of layers 29, 30, 25 separates conductors $M_N$ and $M_{N+1}$. Composite layer 21 includes $M_N$ conductors 22, 23, a first (e.g., electrically insulating) cap layer 29, a second (e.g., electrically insulating) cap layer 30, insulator 25, via $V_{N+1/N}$ conductor 26, $M_{N+1}$ conductor 24 and dielectric region 27 substantially laterally surrounding $M_N$ conductors 22, 23, all resting on under-structure 28. Under structure 28 may be a semiconductor die or wafer, or an insulator, or a semiconductor on insulator (SOI) substrate, or another underlying two-level interconnection structure. The index N=1, 2, 3, . . . is used in FIGS. 1-3 and elsewhere to indicate that any number of two-level interconnection composite layers 21 of FIG. 2 and composite layers 41 of FIG. 3 may be stacked so that the desired interconnection complexity can be achieved.

Referring still to FIG. 2, when coupled, $M_N$ conductor 22 and $V_{N+1/N}$ conductor 26 are at one potential, but $M_N$ conductor 23 may be at another significantly different potential. It will be noted that lower left corner 261 of $V_{N+1/N}$ conductor 26 is separated from upper right corner 231 of $M_N$ conductor 23 by critical dimension ($CD_N$) 31 along interface 271 between dielectric region 27 and cap layer 29. The actual size of $CD_N$ 31 depends upon the amount of misalignment of $V_{N+1/N}$ conductor 26 with respect to $M_N$ conductors 22, 23. Persons of skill in the art will understand that some misalignment is inevitable, since lower level $M_N$ conductors 22, 23 are typically formed in one masking operation and via $V_{N+1/N}$ conductor 26 is formed in a separate masking operation. As the circuit and interconnect packing density increases, separation distance 32 between $M_N$ conductor 22 and $M_N$ conductor 23 often becomes smaller and the potential adverse impact of $CD_N$ 31 becomes larger. If $CD_N$ 31 is small enough, significant leakage current can flow between $V_{N+1/N}$ conductor 26 and $M_N$ conductor 23 either through the bulk of layer 29 or along interface 271 between dielectric region 27 and layer 29. Further, when $V_{N+1/N}$ conductor 26 and $M_N$ conductor 23 are made of somewhat mobile materials, such as copper or gold, then electro-migration may become significant, leading to a time (at voltage) dependent failure mechanism, whereby the resistance along interface 271 of $CD_N$ 31 decreases with time leading to eventual failure of the IC of which interconnection 19 forms a part.

Figure 3:
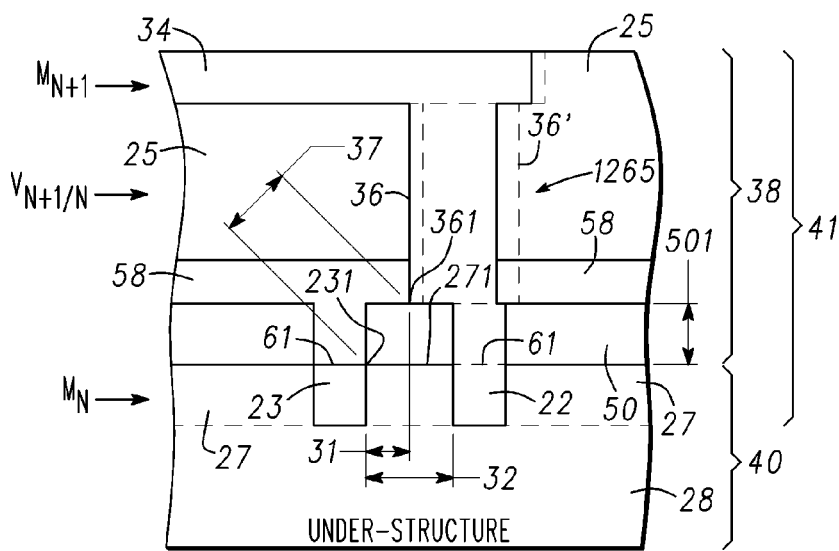
FIG. 3 shows a simplified cross-sectional view of the two-level interconnection of FIG. 1 according to an embodiment of the invention, in which the adverse effect of the via alignment variation illustrated in FIG. 2 is substantially reduced or avoided.

FIG. 3 shows a simplified cross-sectional view of the two-level interconnection of FIG. 1 formed by two-level interconnection 39 according to an embodiment of the invention in which the adverse effect of the via misalignment or encroachment illustrated in FIG. 2 is substantially reduced or avoided. The index N may be applied to interconnection 39, e.g., as in 39-N, to indicated that it may be replicated N times in a stack of such two-level interconnections, each of the individual two-level interconnections having lower conductors $M_N$ and upper conductors $M_{N+1}$ and conductive vias $V_{N+1/N}$ joining some of the $M_{NA}$ conductors to some of the underlying $M_N$ conductors. Elements or regions 22, 23, 25 and 27 are substantially the same in two-level interconnection 39 of FIG. 3 as in two-level interconnection 19 of FIG. 2 and the description thereof given in connection with FIG. 2 is included herein by reference. Two-level interconnection 39 includes composite layer 41 resting on under-structure 28. Interlayer dielectric 38 made up of layers 50, 58, 25 separates conductors $M_N$ and $M_{N+1}$. Some parts of layer 25 may extend around conductors $M_{N+1}$. Composite layer 41 includes $M_N$ conductors 22, 23, a first (e.g., electrically insulating) cap layer 50, a second (e.g., electrically insulating) cap layer 58, insulator 25, via $V_{N+1/N}$ conductor 36, upper $M_{N+1}$ conductor 34, and dielectric region 27 substantially laterally surrounding $M_N$ conductors 22, 23, all supported by under-structure 28. An noted earlier, under structure 28 may be a semiconductor die or wafer, or an insulator, or a semiconductor on insulator (SOI) substrate, or another underlying two-level interconnection structure, or whatever. The combination of dielectric region 27 and under-structure 28 is also referred to as substrate 40.

Two-level interconnection 39 of FIG. 3 differs from two-level interconnection 19 of FIG. 2 in that lower portion 362 of via $V_{N+1/N}$ conductor 36 is arranged to be self-aligned with underlying $M_N$ conductor 22 while upper portion 1265 of $V_{N+1/N}$ conductor 36 is arranged to be self-aligned with overlying $M_{N+1}$ conductor 34. With this arrangement, the critical dimension ($CD_N$) along interface 271 corresponds to separation distance 32 between $M_N$ conductor 22 and $M_N$ conductor 23, rather than smaller $CD_N$ distance 31 of FIG. 2. Upper right corner 231 of $M_N$ conductor 23 is now separated from lower left corner 361 of upper portion 1265 of via $V_{N+1/N}$ conductor 36 by $CD_N$ 37, which by simple geometry may be seen to be larger than $CD_N$ 31 of FIG. 2. By adjusting thickness 341 of layer 34, $CD_N$ 37 may be made even larger, thereby increasing the corresponding leakage path and decreasing the corresponding leakage current. Thus, for the same amount of lateral misalignment or encroachment, the structure of FIG. 3 will have lower leakage current and significantly reduced electro-migration for the same operating voltages than the prior art arrangement of FIG. 2. Even if there is no misalignment, the situation is improved because of the greater separation of $M_N$ conductor 23 and $V_{N+1/N}$ conductor 36. This is a significant advance in the art. Additionally, if the situation arises in the course of further IC shrinkage where conductor spacings are still further reduced while mask alignment tolerances remain substantially unchanged or shrink at a slower pace than the conductor spacings, $CD_N$ dimension 37 may be further increased by increasing the thickness of layer 50. This is an additional advantage of two-layer interconnection 39 illustrated in FIG. 3 compared to prior art two level interconnection 19 of FIG. 2. Persons of skill in the art will understand that this arrangement may be applied to any or all levels 39-N of an N-level interconnection stack by superposing composite layers 41 with appropriate shapes and locations of conductors $M_N$, $M_{N+1}$ and $V_{N+1/N}$ and layer 50 or equivalent in each composite layer 41, corresponding to the increased $CD_N$ arrangement illustrated in FIG. 3.

FIGS. 4-17 illustrate in cross-sectional view, methods for manufacturing an IC during various stages of manufacture 504-517 according to further embodiments of the invention, of which only the interconnection portion is illustrated, according to the arrangement of FIG. 3, and for a situation in which $M_{N+1}$ and $M_N$ are substantially parallel. Structures 604-617 result from manufacturing stages 504-517. For convenience of illustration and not intended to be limiting, $M_{N+1}$ and $M_N$ are illustrated in FIGS. 4-17 as being substantially parallel rather than perpendicular as shown in FIGS. 1-3. Persons of skill in the art will understand that manufacturing stages 504-517 illustrated in FIGS. 4-17 can be used to provide multi-layer conductor arrangements in which successive conductor layers $M_{N+1}$ and $M_N$ (N=1, 2, 3, ... etc.) have any relative azimuthal orientation. Persons of skill in the art will also understand that the first two-level interconnection 39-1 (e.g., for N=1) has conductor layers $M_N=M_1$ and $M_{N+1}=M_2$, and the second two-level interconnection 39-2 (e.g., for N=2) has conductor layers $M_N=M_2$ and $M_{N+1}=M_3$, and so forth. Accordingly, with interconnections 39 illustrated in FIGS. 3 and 4-17 stacked, then for interconnection 39-N with N=i, the upper conductor layer (e.g., $M_{N+1}=M_{i+1}$) of the first or underlying level 39-$i$ is the same as the lower conductor layer (e.g., $M_N=M_{i+1}$) of the second or overlying composite level 39-($i$+1) corresponding to N=i+1, and so forth for all successive interconnection layers or levels 39-N in the interconnection stack.

Figure 4:
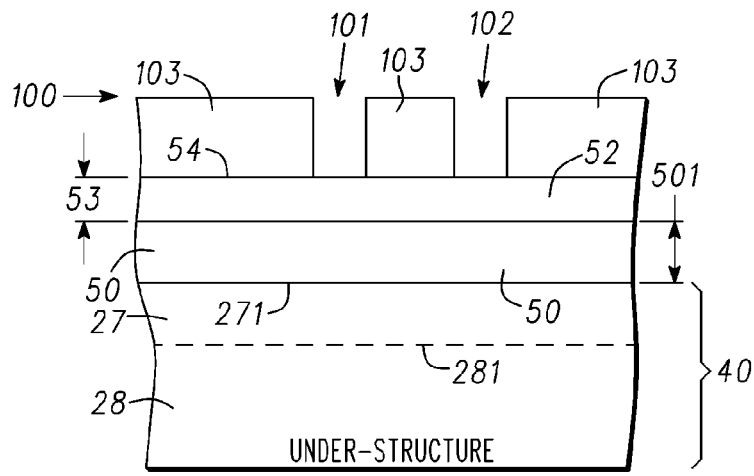
FIGS. 4-17 illustrate in cross sectional view, methods for manufacturing an IC during various stages of manufacture according to further embodiments of the invention, of which only the interconnection portion is illustrated, according to the arrangement of FIG. 3, and for a situation in which $M_{N+1}$ and $M_N$ are substantially parallel.

Referring now to manufacturing stage 504 of FIG. 4, under-structure 28 having upper surface 281 is provided. As noted earlier, under-structure 28 may be a semiconductor die or wafer, or an insulator, or a semiconductor-on-insulator (SOI) substrate, or another underlying two-level interconnection structure, or whatever. In a typical arrangement, the active devices that make up the remainder of the IC are located in understructure 28, whose fabrication will depend on the particular IC being implemented. Active and passive device fabrication is well known in the art. The index N=1, 2, 3, ... is used to indicate that any number of two-level interconnection composite layers 41 of FIG. 3 may be stacked so that the interconnection complexity desired for the completed IC can be achieved. It is presumed that (e.g., dielectric) layer or region 27 with upper surface 271 in which first layer conductors $M_N$ will be formed is present on upper surface 281 of under-structure 28. Dielectric region 27 can be provided as a part of under-structure 28 or formed thereon. Either arrangement is useful. The combination of dielectric region 27 and under-structure 28 is also referred to as substrate 40. Cap layer 50 of initial thickness 501' and cap layer 52 of thickness 53 are desirably formed on upper surface 271 of layer or region 27. While only two cap layers 50, 52 are illustrated, in other embodiments, additional cap layers may be provided to facilitate, for example and not intended to be limiting, masking and differential etching. Cap layer 50 of FIGS. 4-17 corresponds to cap layer 50 of FIG. 3.

Cap layer 50 of initial thickness 501' is desirably a dielectric or other substantially insulating material that is differentially etchable with respect to the materials adjacent to it, as for example, dielectric region 27, the conductor material eventually used to form conductor layer $M_N$, and further layers that may lie above layer 50. Cap layer 50 can also serve as a hard mask during subsequent thinning or etching operations. Silicon nitride, silicon oxide and silicon carbide are non-limiting examples of useful materials for cap layer 50, but other selectively etchable dielectric materials may also be used. Silicon nitride is preferred. It will be understood that different materials may be used for cap layer 50 in successive two-layer interconnections 39-N. By way of example and not intended to be limiting, thickness 51' is conveniently in the range of about 10 to 300 nanometers and preferably in the range of about 20 to 100 nanometers, but other thicknesses may be used in other embodiments.

Cap layer 52 of thickness 53 and upper surface 54 is desirably a blocking layer to prevent interlayer diffusion of the conductors used for $M_N$ and to facilitate differential etching. Titanium nitride, silicon nitride, silicon oxide and combinations thereof are non-limiting examples of useful materials for cap layer 52, but other blocking and etch resistant materials may also be used. Titanium nitride is preferred. It will be understood that different materials may be used for cap layer 52 in successive two-layer interconnections 39-N. By way of example and not intended to be limiting, thickness 53 is conveniently in the range of about 1 to 200 nanometers and preferably in the range of about 20 to 100 nanometers, but other thicknesses may be used in other embodiments. In still other embodiments, layer 52 may be omitted.

Referring again to FIG. 4, overlying cap layer 52 is mask layer 100 having open portions 101, 102 and closed portions 103. Mask 100 is used to etch cavities 105, 106 (see FIG. 5) underlying open portions 101, 102, respectively, that will eventually (see FIG. 6) be filled with the material making up the $M_N$ conductors. Accordingly, openings 101, 102 substantially define the size and location of $M_N$ conductors 23, 22, respectively. Photoresist is a suitable material for mask 100, but other hard or soft mask materials well known in the art may also be used. It is desirable to include an anti-reflection under-layer (not shown) beneath mask 100, but it may be omitted in other embodiments. Such anti-reflection under-layers are well known in the art. Structure 604 results from manufacturing stage 504.

Referring now to manufacturing stage 505 of FIG. 5, structure 604 of FIG. 4 is etched or otherwise abraded to provide cavities 105, 106 extending through cap layers 50, 52 into dielectric region 27 to depth 272 below surface 271. Depth 272 will depend upon the desired conductivity of conductors $M_N$. By way of example and not intended to be limiting, depth 272 conveniently in the range of about 1 to 300 nanometers and preferably in the range of about 40 to 200 nanometers, but other depths may also be used in other embodiments. $CHF_3$, $CH_3F_4$, $CCl_4$, $SF_6$ and Ar are non-limiting examples of useful means of forming cavities 105, 106, but other etching or abrading technologies may also be used, depending on the materials making up region 27 and CAP layers 50, 52. For the material combinations illustrated above, Ar is preferred for penetrating layer 52 and $CHF_3$ is preferred for etching layer 50 and region 27. Structure 605 results from manufacturing stage 505.

Figure 5:
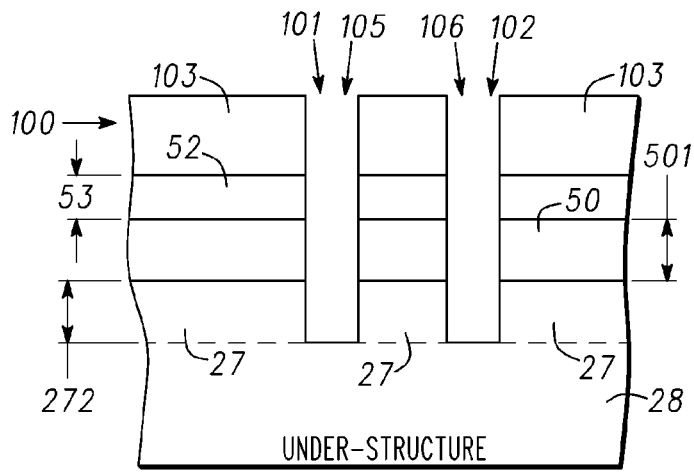
Figure 6:
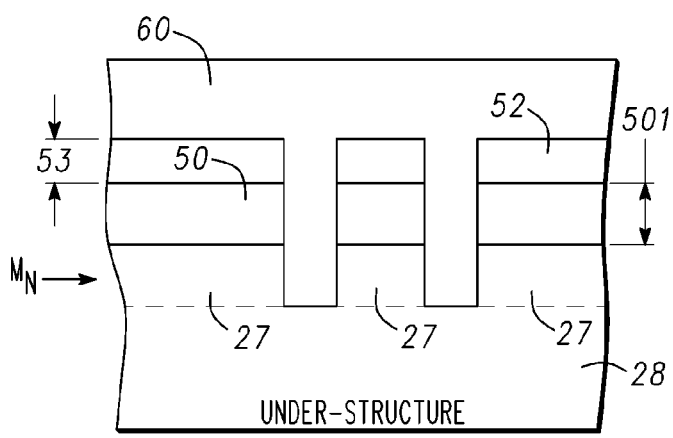

Referring now to manufacturing stage 506 of FIG. 6, cavities 105, 106 of structure 605 of FIG. 5 are filled with the conductive material (or materials) 60 desired for conductors $M_N$. Mask 100 may be left in place during such filling operation or, as shown, removed prior thereto. Either arrangement is useful. Copper, aluminum, cobalt and tungsten are non-limiting examples of suitable conductors for filling cavities 105, 106, but other conductors may also be used. Copper is preferred, generally applied primarily by electro-plating, but other materials and application techniques well known in the art may also be used. It is desirable to first line cavities 105, 106 with a thin seed layer (not shown) of tantalum or tantalum-nitride before depositing the copper, but other seed materials may also be used. Tantalum is a preferred seed material. Techniques for applying seed layers and filling in cavities 105, 106 with plated copper or other conductor materials are well known in the art. Structure 606 results from manufacturing stage 506, wherein cavities 105, 106 have been filled with conductor 60 that will make up $M_N$ conductors 22, 23.

Figure 7:
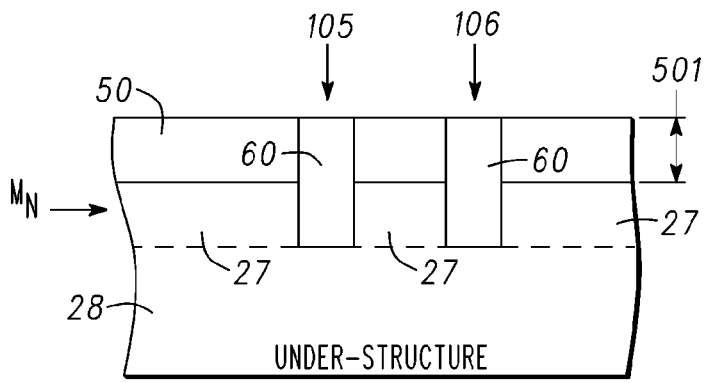

Referring now to manufacturing stage 507 of FIG. 7, structure 606 of FIG. 6 is treated to remove that portion of conductor 60 overlying cap layer 52 (and mask 100 if still present) and cap layer 52; stopping approximately at upper surface 56 of layer 50. In this respect it is desirable that cap layer 50 be relatively more resistant to whatever removal technique is being used than overlying layer 52, so that stopping the removal process on reaching layer 50 is facilitated. Spectroscopic measurements made during the thinning process may be used to detect when layer 50 has been reached. Chemical-mechanical-polishing (CMP) is a preferred means of removing these layers or regions, but other removal techniques can also be used. Conductor material 60 within cavities 105, 106 above the level of surface 56 is also conveniently removed during this process, but this is not essential. Remaining thickness 501 of layer 50 is usefully in the range of about 1 to 500 nanometers, more conveniently in the range of about 1 to 300 nanometers and preferably in the range of about 10 to 100 nanometers, but larger and smaller thicknesses may also be used. Structure 607 results from manufacturing stage 507.

Referring now to manufacturing stage 508 of FIG. 8, structure 607 of FIG. 7 is desirably but not essentially selectively etched or otherwise treated so that upper surface 61 of conductor material 60 in cavities 105, 106 is recessed by distance 57 below upper surface 56 of cap layer 50 in portion 62 of cavities 105, 106. In a preferred embodiment, distance 57 is less than or equal thickness 501 of layer 50, so that upper surface 61 of conductor 60 remains at or above the level of upper surface 271 of region 27. This avoids having portions of region 27 in the sidewalls of cavities 105, 106 exposed to subsequent processing. This is desirable to avoid or minimize electro-migration effects depending upon the particular material making up dielectric region 27, which may be different for different interconnection levels.

Recessing of upper surface 61 of conductors 22, 23 shown in manufacturing stage 508 in portion 62 of cavities 105, 106 may, in one embodiment, be carried out during CMP by taking advantage of the differential removal rate between conductor material 60 in cavities 105, 106 and the surrounding material of layer 50 (or layer 50 and any overlying layers). In another embodiment, recessing upper surfaces 61 of conductors 22, 23 shown in manufacturing stage 508 in portion 62 of cavities 105, 106 may be carried out after CMP is finished by wet or dry etching of exposed upper surfaces 61 of conductor 60 in cavities 105, 106. Either technique is useful. The choice of etchant will depend upon the choice of conductor 60. Since cap layer 50 is preferably of a dielectric and of substantially different composition than conductor 60 in cavities 105, 106, choosing a selective etchant or other removal technique is within the competence of persons of skill in the art. Where conductor 60 contains copper, then recessing upper surface 61 of conductor 60 in upper portions 62 of cavities 105, 106 can be accomplished, for example, by oxidation of conductor 60 to the desired depth and then etch removal of the oxidized conductor using HF acid or other reagent that is reasonably selective to the oxide of conductor 60, but other removal techniques may also be used, such as for example and not intended to be limiting, direct wet or dry etch of upper surfaces 61 of conductor 60 exposed in upper portions 62 of cavities 105, 106. The portions of conductor 60 remaining in lower portions 107 of cavities 105, 106 provide $M_N$ conductors 23, 22, respectively, shown in FIGS. 3 and 8. Structure 608 results from manufacturing stage 508.

Figure 8:
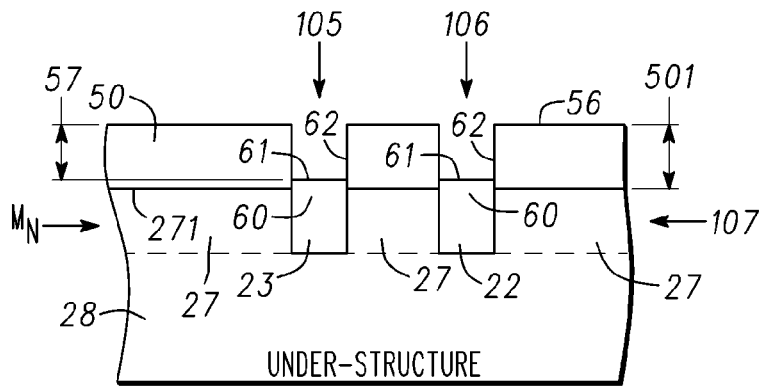
Figure 9:
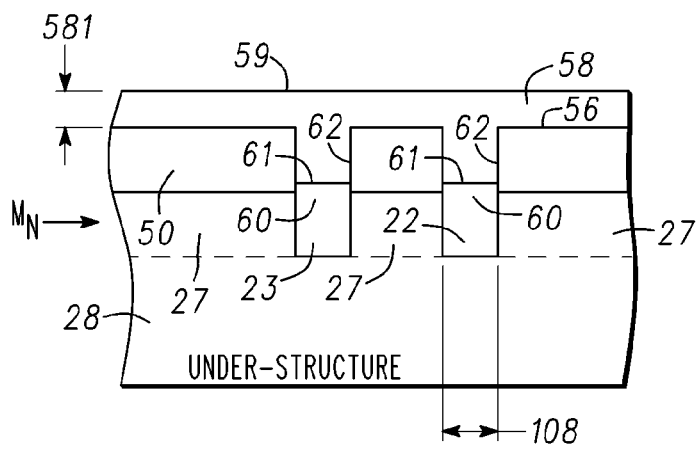

Referring now to manufacturing stage 509 of FIG. 9, structure 608 of FIG. 8 is then optionally covered by further cap layer 58 having upper surface 59. Cap layer 58 of FIGS. 9-17 corresponds to cap layer 58 of FIG. 3. If structure 508 will be subsequently exposed to relatively high temperatures (which facilitate metal migration) providing cap layer 58 is desirable to inhibit metal migration from conductors 22, 23. However, if such high temperature exposure is not needed, then layer 58 may be omitted, that choice depending on the material of conductor 60 and the subsequent overall thermal budget during the manufacturing process for interconnection 39 and the associated IC of which interconnection 39 is a part. Such thermal budget planning is a familiar exercise in the art. While a useful purpose of cap layer 58 is to limit out-diffusion of the material of conductor 60 of $M_N$ conductors 22, 23, it is also desirable that it be differentially etchable with respect to cap layer 50 and vice-versa. Silicon carbide, silicon oxide, titanium nitride, carbon and carbon rich compounds are non-limiting examples of materials useful for cap layer 58. Silicon carbide is preferred. By way of example and not intended to be limiting, thickness 581 of cap layer 58 is conveniently in the range of about 1 to 100 nanometers, and preferably in the range of about 1 to 50 nanometers, but other thicknesses may be used in other embodiments. Structure 609 results from manufacturing stage 509.

Figure 10:
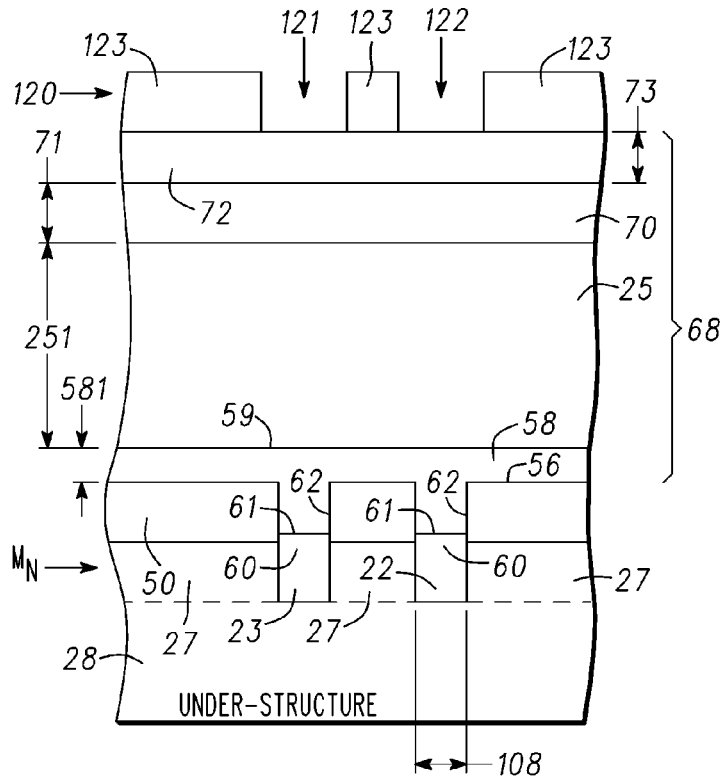

Referring now to manufacturing stage 510 of FIG. 10, insulator 25 of thickness 251 is formed over surface 59 of cap layer 58 of structure 609 of FIG. 9 if cap layer 58 is present or over cap layer 50 and exposed surfaces 61 of conductors 22, 23 if cap layer 58 is not present. The choice of material for insulator 25 will depend on many factors, as for example, the interlayer capacitance and leakage current that the IC design can tolerate as well as the deposition or growth and etch chemistries that accompany different material choices. There are many candidates and the exact dielectric interlayer material choice for a particular IC design will vary with such design and its associate manufacturing facilities, and is within the competence of those of skill in the art. Both organic and inorganic materials may be used. Low k dielectrics are generally preferred, where k is the permittivity of the material of insulator 25. Carbon-doped silicon oxide known in the art as "SICOH", or "SiOC" and octa-methyl-cyclo-tetra-siloxane known in the art as "OMCTS", are non-limiting examples of well known materials useful for insulator 25, but other dielectric materials may also be used. OMCTS is preferred. By way of example and not limitation, thickness 251 of insulator 25 is conveniently in the range of about 1 to 500 nanometers and preferably in the range of about 20 to 300 nanometers, but other thicknesses may be used in other embodiments. As noted earlier, cap layer 58 may be omitted or combined with insulator 25.

Overlying insulator 25 are cap layer 70 of thickness 71, cap layer 72 of thickness 73 and mask layer 120. While only two cap layers 70, 72 are illustrated, in other embodiments, additional cap layers may be provided to facilitate, for example and not intended to be limiting, masking and differential etching. In a further embodiment, mask layer 120 may have an underlying antireflection coating (not shown). Such coatings for use in IC photo-masking operations are well known in the art. Cap layer 70 is similar in function and desired properties to cap layer 50, and the discussion thereof in connection with the preceding figures is incorporated herein by reference. Silicon nitride is a preferred material for cap layer 70. By way of example and not limitation, thickness 71 of cap layer 70 is conveniently in the range of about 10 to 300 nanometers and preferably in the range of about 20 to 100 nanometers, but larger and smaller thicknesses may also be used in other embodiments.

Figure 15:
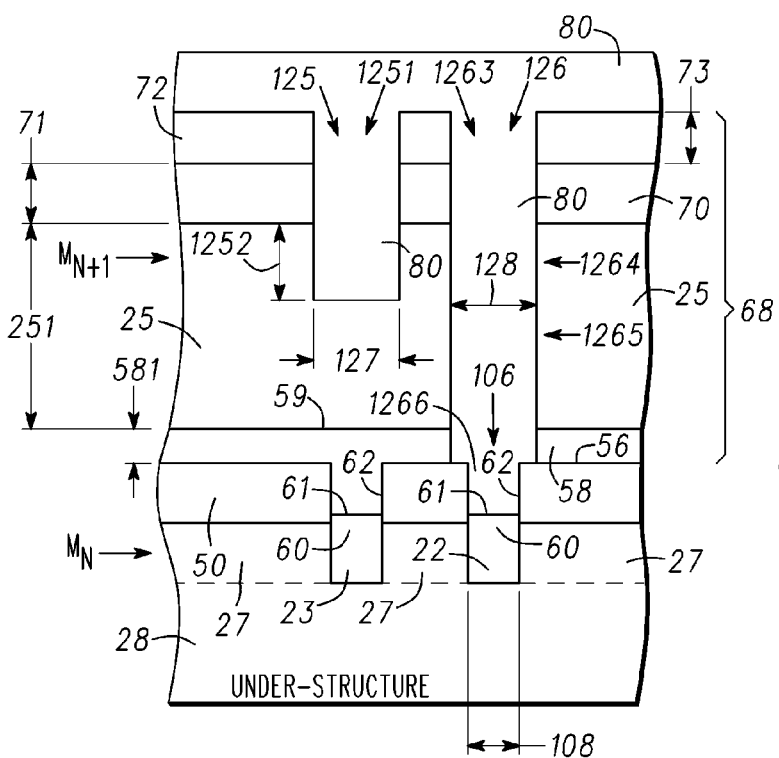
Figure 16:
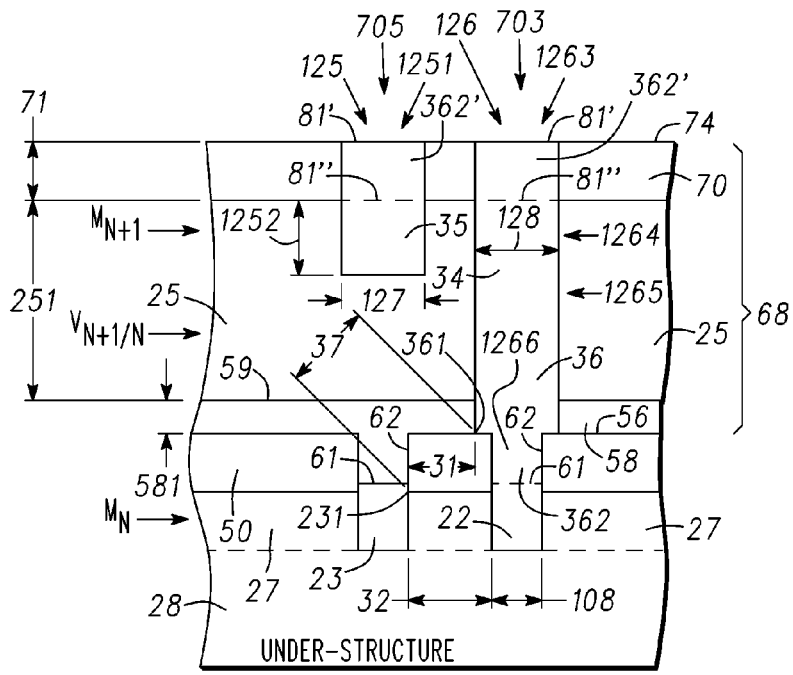
Figure 17:
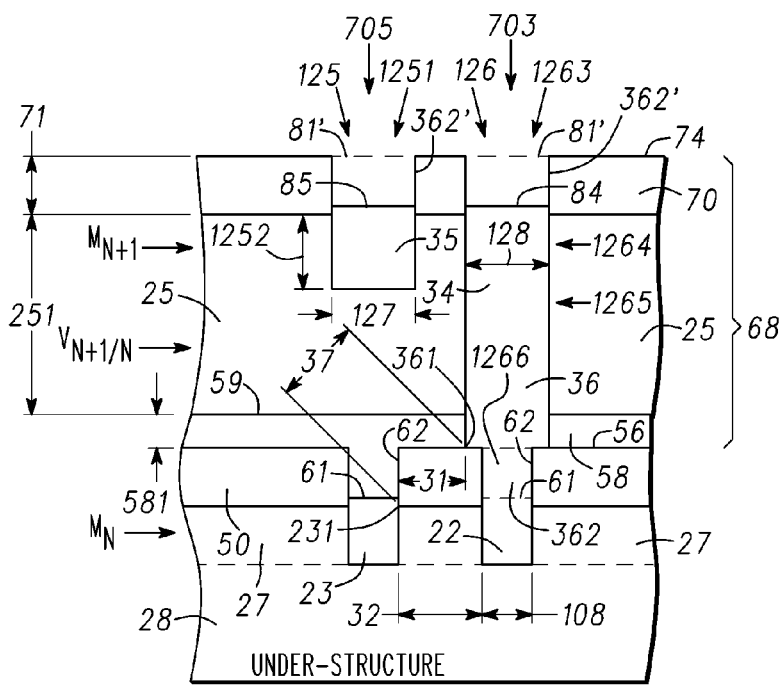

Cap layer 72 is used, among other things, to provide a hard mask for defining the locations of conductors $M_{Nq}$, and in part for defining the location and size of via $V_{N+1/N}$. Titanium nitride, silicon nitride, and silicon oxide are non-limiting examples of suitable materials for cap layer 72, but other materials may also be used. Titanium nitride is preferred for cap layer 72. By way of example and not limitation, thickness 73 of layer 72 is conveniently in the range of about 1 to 200 nanometers and preferably in the range of about 20 to 100 nanometers, but other thicknesses may also be used in other embodiments. Mask 120 is conveniently of photoresist but other hard or soft mask materials well known in the art may also be used. Mask 120 has open portions 121, 122 and closed portions 123. Among other things, openings 121, 122 will substantially define the location and lateral dimensions of upper conductors $M_{N+1}$ in interconnection 39-N, where the index N identifies the particular interconnection stack level. Structure 610 results from manufacturing stage 510. For convenience, the terms "dielectric interlayer 68" and "interlayer dielectric 68" are used to refer collectively to one or more of layers 58, 25, 70, 72 since at various times during fabrication they will separate upper conductors $M_{N+1}$ and lower conductors $M_N$, and as shown in FIGS. 15-17 conductors 80 and 60 used to form upper and lower conductors $M_{N+1}$ and $M_N$. Dielectric interlayer 68 of FIGS. 10-17 is analogous to interlayer 38 of FIG. 3, but omitting layer 50. It will also be apparent that during later manufacturing stages, some of layers 58, 25, 70, 72 may be removed from interlayer 68.

Figure 11:
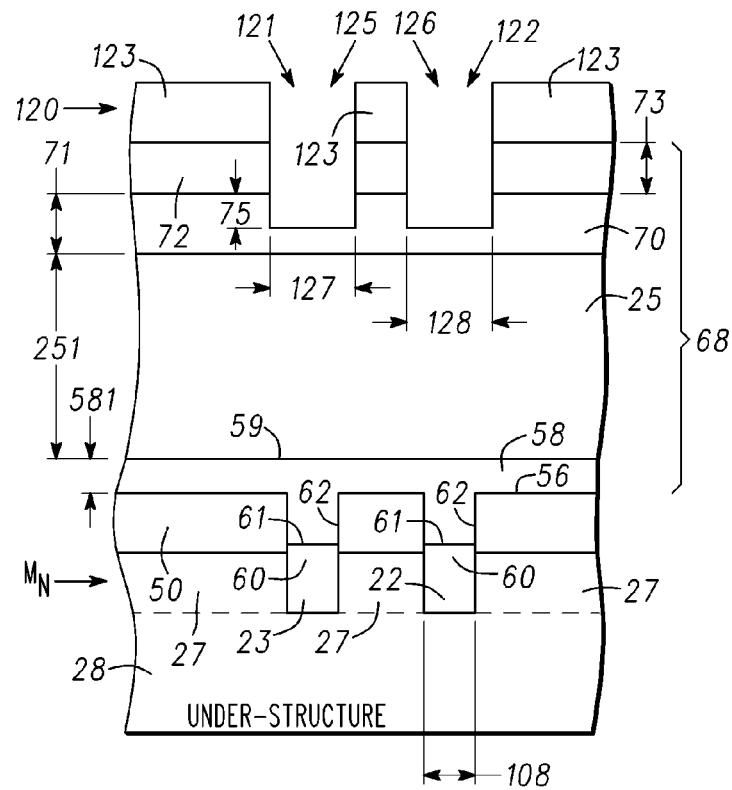

Referring now to manufacturing stage 511 of FIG. 11, structure 610 of FIG. 10 is etched or otherwise abraded to form cavities 125, 126 of lateral widths 127, 128 respectively through mask openings 121, 122 respectively. Mask openings 121, 122 and resulting widths 127, 128 of cavities 125, 126 substantially determine the location and lateral widths of conductors $M_{N+1}$. Cavity 126 can also determine the lateral width of via $V_{N+1/N}$ whose location is determined in manufacturing stage 512 of FIG. 12. These lateral widths are shown here as being slightly wider than the equivalent openings and cavities used to form conductors $M_N$ in connection with FIGS. 4-9, but this is merely for convenience of presentation and not intended to be limiting. Conductors $M_{N+1}$ and conductors $M_N$ and vias $V_{N+1/N}$ may have the same lateral widths or larger or smaller lateral widths, depending jupon the desires of the designer and the capabilities of the manufacturing line, and such lateral widths may be different in different azimuthal orientations. All such arrangements are useful and may vary from interconnection level to interconnection level. $CHF_3$, $CH_3F_4$, $CCl_4$, SF6, and Ar are non-limiting examples of useful etching means for forming cavities 125, 126. Ar is preferred for penetrating layer 72 and $CHF_3$ is preferred for etching layer 70. Trenches or cavities 125, 126 are etched through cap layer 72 and, desirably but not essentially at least part way through cap layer 70, so that thickness 75 of cap layer 70 remains at the bottoms of cavities 125, 126. Thickness 75 remaining of cap layer 70 is usefully about 1 to 90 percent of initial thickness 71 of cap layer 70, more conveniently about 10 to 70 percent of initial thickness 71 of cap layer 70, and preferably about 10 to 50 percent of initial thickness 71 of cap layer 70, although other percentages may also be used in other embodiments. In still other embodiments, cavities 125, 126 may be etched through cap layer 70. Either arrangement is useful. Structure 611 results from manufacturing stage 511.

Figure 12:
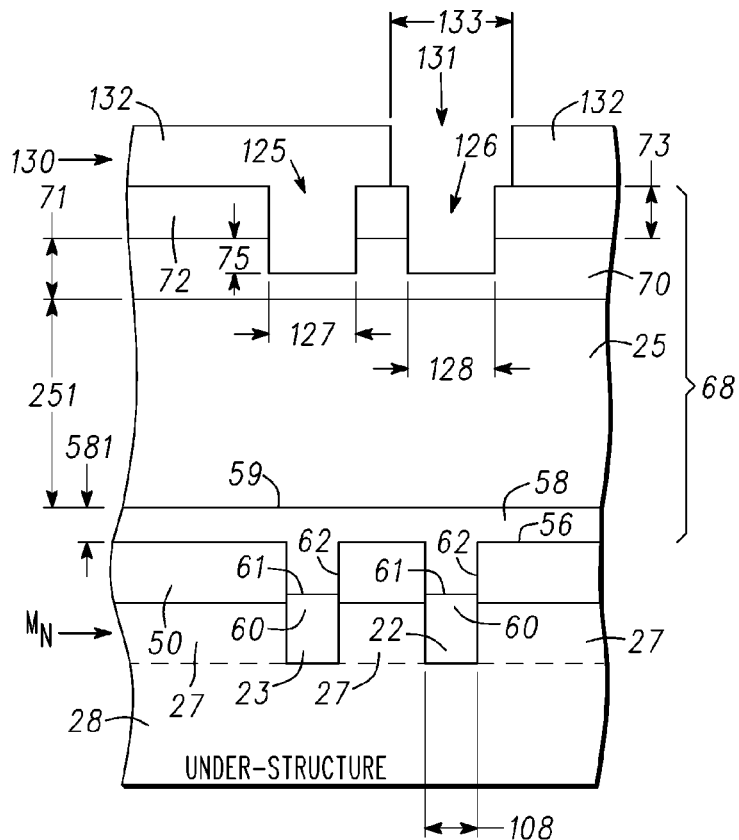

Referring now to manufacturing stage 512 of FIG. 12, mask 120 is removed from structure 611 of FIG. 11 and replaced by mask 130 having open portion 131 and closed portions 132. Mask 130 defines the location of $V_{N+1/N}$, in combination with cavity 126 already formed. Photoresist is a suitable material for mask 130, but other hard or soft mask materials well known in the art may also be used. As with mask 120, an antireflection layer (not shown) may be provided under mask 130 in still additional embodiments. Open portion 131 of lateral width 133 defines the intended location, if not the exact size of via conductor(s) $V_{N+1/N}$. For convenience of presentation, lateral width 133 of mask opening 131 is shown as being slightly larger than lateral width 128 of cavity 126 formed in manufacturing stage 511, but in other embodiments wider or narrower or the same widths may also be used. Structure 612 results from manufacturing stage 512.

Figure 13:
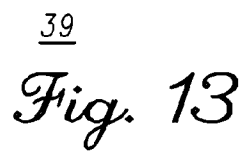

Referring now to manufacturing stage 513 of FIG. 13, structure 612 of FIG. 12 is etched, preferably with mask 130 still in place to create cavity 1261 of substantially the same lateral width 128 as cavity 126 of FIG. 12, but extending through cap layers 72, 70 to depth 1262 in underlying insulator 25 beneath CAP layer 70. The upper portion of mask 130 may be partially eroded in the course of etching deeper cavity 1261, but sufficient remains to protect cavity 125 from extending into cap layer 70 under closed portion 132 of mask 130. Mask 130 (if present) and layers 72 and 70 act as etch masks to define cavity 1261 substantially of lateral width 128 and initial depth 1262. Sputtering and reactive ion etching are non-limiting examples of useful etching procedures for providing cavity 1261, but other etching or material removal methods may also be employed. Reactive ion etching (RIE) is preferred, using reagents already described or well known in the art for the particular materials encountered. Structure 613 results from manufacturing stage 513.

Figure 14:
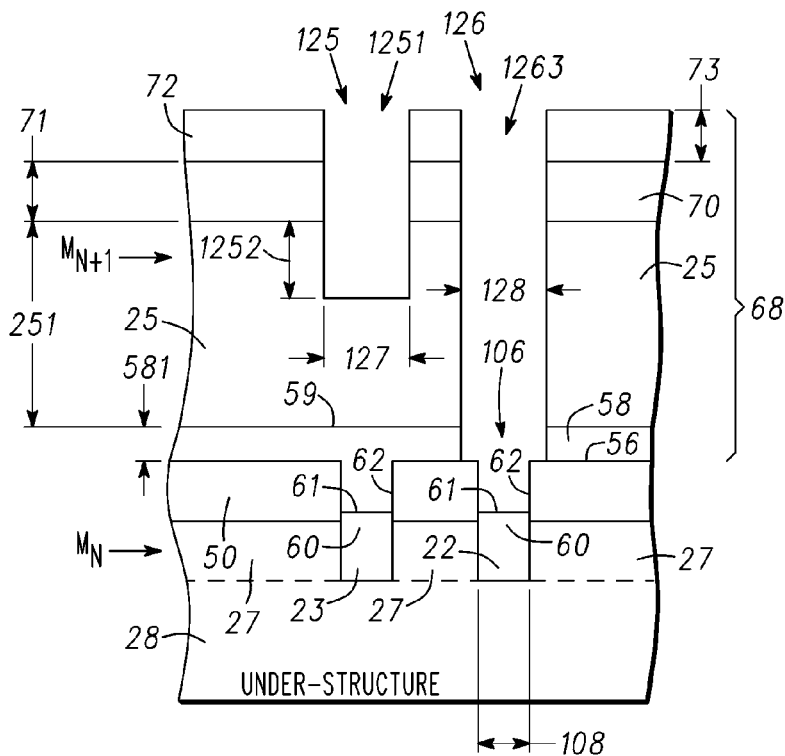

Referring now to manufacturing stage 514 of FIG. 14, structure 613 of FIG. 13 is further etched using methods already described to provide deeper cavity 1263 substantially of width 128 through insulator 25 and through cap layer 58 to reach cap layer 50 and upper surface 61 of conductor 22 in portion 62 of cavity 106. Cap layer 50 is desirably insensitive to the etch desirably used for penetrating insulator 25 and cap layer 58, so portion 62 of layer 50 surrounding cavity 106 in layer 50 above surface 61 of $M_N$ conductor 22 remains substantially intact while the material of, for example, cap layer 58 that lies within cavity 106 above surface 61 of $M_N$ conductor 22 is removed, thereby exposing upper surface 61 of $M_N$ conductor 22 of lateral width 108. In this example, lateral width 108 of lower part 1266 of cavity 1263 within cavity 106 in cap layer 50 is less than lateral width 128 of the upper part 1264, 1265 of cavity 1263 above cap layer 50, but this is merely for convenience of illustration and not intended to be limiting. Lateral width 128 is preferably larger than lateral width 108, but this is not essential. Either arrangement is useful.

Still referring to FIG. 14, at the same time that cavity 1263 is being formed, cavity 1251 is desirably etched through the remainder of cap layer 50 below initial cavity 125 and into insulator 25 to depth 1252. Depth 1252 of cavity 1251 is less than the depth of cavity 1263 because etching through remaining thickness 75 of cap layer 70 under initial cavity 125 (see FIGS. 11-13) must occur before cavity 1251 can reach insulator 25. Thus, cavity 1263 can penetrate all the way through insulator 25 to upper surface 61 of $M_N$ conductor 22, while cavity 1251 penetrates only to depth 1252. In yet other embodiments, an additional masking step (not shown) in which a mask analogous to mask 130 is provided, having an opening exposing cavity 125 and a closed portion covering cavity 1261 or cavity 1263, depending on whether cavity 1251 is etched before or after cavity 1263. This further mask is used to etch cavity 1251 separately from cavity 1263. Either arrangement is useful. Depth 1252 may be adjusted according to the desired thickness of conductor $M_{NA}$ that will be formed in cavity 1251 during later manufacturing stages. Structure 614 results from manufacturing stage 514.

Referring now to manufacturing stage 515 of FIG. 15, conductor 80 is applied to structure 614 of FIG. 14 in order to fill cavities 1251 and 1263 in substantially the same manner and using substantially the same materials as described for conductor 60 of FIGS. 5-7, although other conductors and application technologies may be used in other embodiments. That portion of conductor 80 in cavity 1251 corresponds to $M_{N+1}$ conductor 35 and that portion of conductor 80 in upper part 1264 of cavity 1263 corresponds to $M_{N+1}$ conductor 34, and that portion of conductor 80 in central part 1265 and in lower part 1266 of cavity 1263 making Ohmic contact to upper surface 61 (see FIG. 14) of $M_N$ conductor 22 corresponds to via conductor $V_{N+1/N}$ 36 of FIGS. 3 and 16-17. The discussion of conductor 60 and resulting $M_N$ conductors 22, 23 in connection with FIGS. 5-7, is incorporated herein by reference with respect to conductor 80 and analogous $M_{NA}$ conductors 34, 35 and connecting via conductor $V_{N+1/N}$ 36 illustrated in FIGS. 16-17. Structure 615 results from manufacturing stage 515. In still other embodiments, conductor materials 60 and 80 may differ.

Referring now to manufacturing stage 516 of FIG. 16, structure 615 of FIG. 15 is eroded, e.g., by CMP in much the same manner as described in connection with FIG. 7, to expose upper surface 74 of cap layer 70 and the remaining portions of conductor material 80 filling openings 703, 705 in cap layer 70 and cavities 1263 and 1251 in insulator 25, which thereby form $M_{N+1}$ conductor 34 and underlying $V_{N+1/N}$ conductor 36 of FIG. 1, and $M_{N+1}$ conductor 35. Cap layers 50 of FIGS. 4-17 corresponds to cap layer 50 of FIG. 3, and cap layer 58 of FIGS. 9-17 is analogous to cap layer 58 of FIG. 3. Interlayer dielectric 68 of FIGS. 15-17 corresponds to interlayer dielectric 38 of FIG. 3 but showing further detail and with layer 50 omitted. Also, layer 72 has been removed from dielectric interlayer 68 in manufacturing stage 516. When several two-layer interconnections are to be stacked, self-aligned portions 362' of $M_{N+1}$ conductors 34, 35 of a second two-level interconnection (e.g., level 39-2) are analogous to self-aligned regions 362 of $M_N$ conductors of the first two-level interconnection (e.g., level 39-1) illustrated by interconnection 39 of FIGS. 3 and 16. Where conductors $M_{N+1}$ are intended to be the uppermost level of a multi-level interconnection stack, the manufacturing process may be terminated at this stage leaving upper surfaces 81' of conductors 34, 35 exposed in cap layer 70, as shown by the solid lines in FIG. 16. In a further embodiment, CMP may be continued until cap layer 70 has also been removed from dielectric interlayer 68 and upper surfaces 81" of conductors 34, 35 are exposed substantially level with upper surface 252 of insulator 25 as shown by the dashed lines in FIG. 16. Either arrangement is useful. Structure 616 results from manufacturing stage 516.

Referring now to manufacturing stage 517 of FIG. 17, a yet further embodiment is illustrated wherein CMP is used to expose upper surface 74 of CAP layer 70. Upper surfaces 81' of conductor material 80 forming $M_{N+1}$ conductors 34, 35 is also exposed and initially substantially level with upper surface 74, as shown by the dashed lines in FIG. 17. Exposed surfaces 81' are then etched or eroded in much the same way as described in connection with FIG. 8 (taking into account any differences in the composition of conductor materials 60 and 80) to provide recessed upper surface 84 of $M_{N+1}$ conductor 34 in cavity 1263 and recessed upper surface 85 of $M_{N+1}$ conductor 35 in cavity 1251, in substantially the same way in which upper surfaces 61 of $M_N$ conductors 22, 23 were recessed in connection with FIG. 8. Structure 617 results from manufacturing stage 517, in which conductors $M_{N+1}$ of level N=1 or (N=i where i is any of 1, 2, 3, . . . etc.) are ready to be used as the lower conductors $M_N$ of level N=2 or N=i+1 and so forth. Thus, self-aligned portion 362 of $V_{N+1/N}$ conductor 36 of FIGS. 3 and 17 contacting surface 61 of conductor level $M_N$, which gives rise to the improved critical dimensions 32, 37, is replicated by self aligned region 362' in cavities 125, 126 above conductor surfaces 84, 85 of $M_{N+1}$ conductors 34, 35. Self-aligned regions 362' arise when the next interconnection level conductors are formed for N=i+1. This means that self aligned region 362' analogous to self-aligned region 362 giving rise to improved critical dimensions 32, 37 can be built into upper conductors $M_{N+1}$ of each two-level interconnection sandwich 39-N, so that successive levels N=2, 3, 4, . . . etc., may be expeditiously stacked to provide any desired multi-level interconnection complexity with the larger critical dimensions 32, 37 obtained in all interconnection levels. Thus, the advantage of enlarged critical dimensions 32, 37 of FIG. 3 can apply to all conductor levels in the stack. This is a significant advance in the art.

Figure 18:
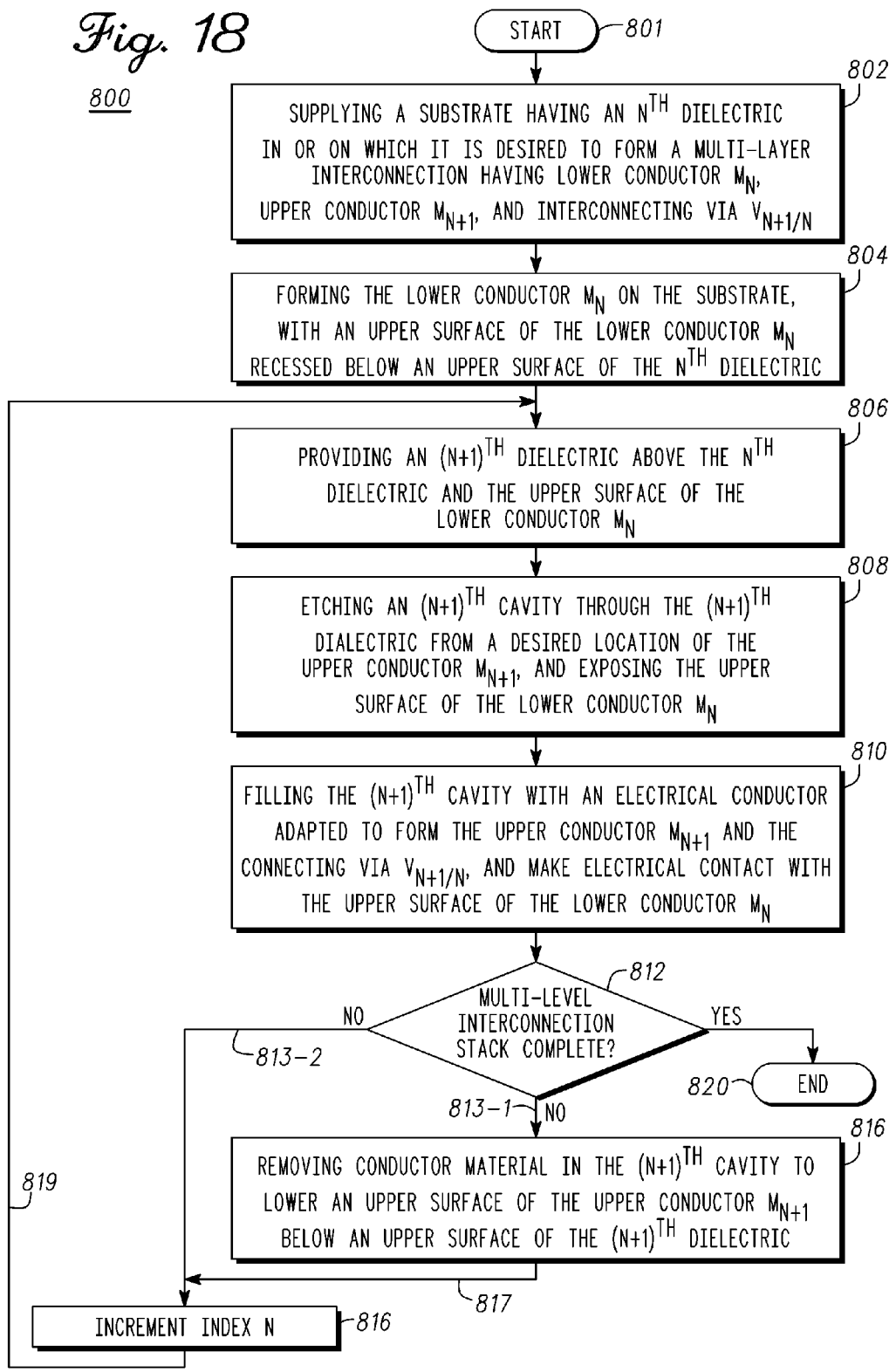
FIGS. 18-19 show a simplified block diagrams of a method for fabricating an IC including the two-level interconnection illustrated in FIGS. 3 and 4-17 and, if desired, stacking them to form multiple interconnection levels, according to still further embodiments of the invention.
Figure 19:
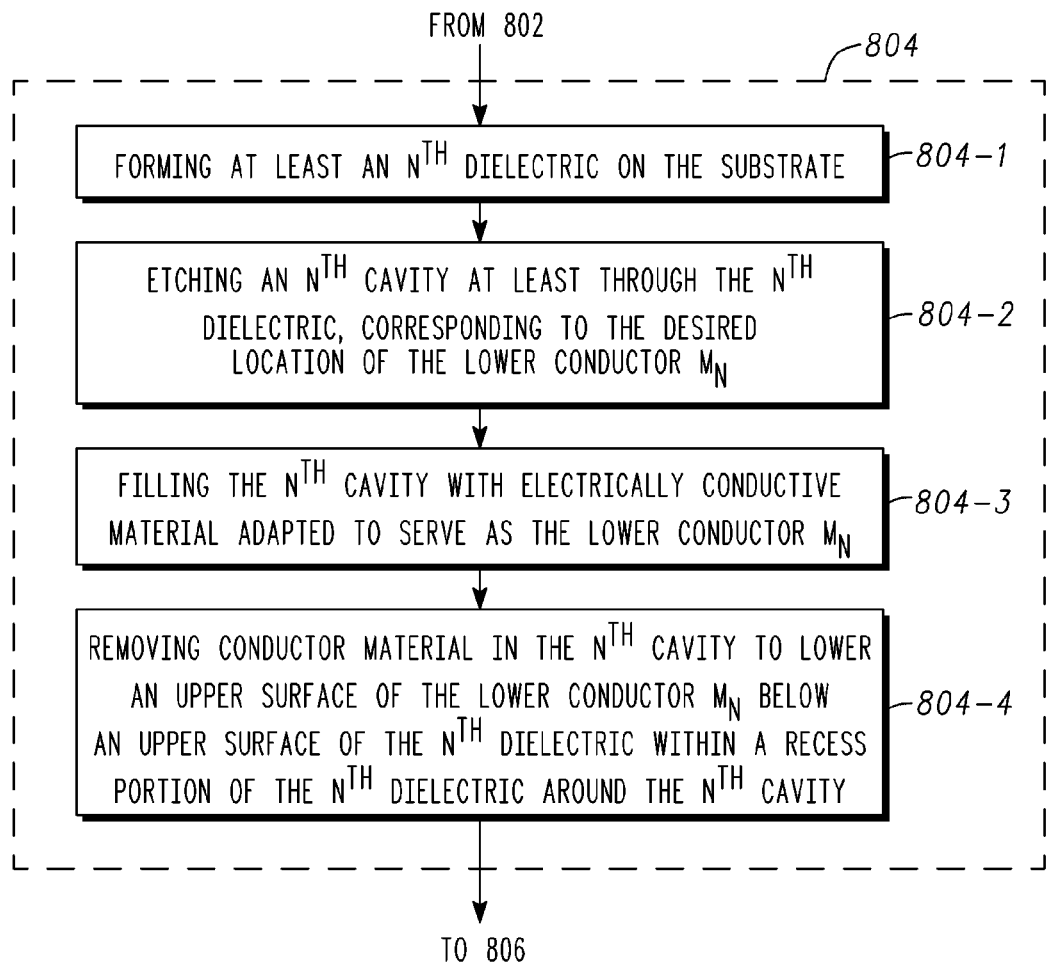

FIGS. 18-19 show simplified block diagrams of method 800 for fabricating an IC including two-level interconnection 39 of FIGS. 3 and 4-17 and, if desired, stacking them to form multiple interconnection levels, according to still further embodiments of the invention. In describing method 800, various reference numbers from FIG. 3 and manufacturing stages 514-517 of FIGS. 4-17 are cited, but these are intended by way of example and not limitation. In describing method 800, it is assumed for convenience of explanation that, $N^{th}$ interconnection level 39-N is being formed where the lower or first conductor layer is $M_N$, the upper or second conductor layer is $M_{N+1}$ and via $V_{N+1/N}$ is provided there between in some locations. In describing various steps of method 800, reference is made to $N^{th}$ and $(N+1)^{th}$ cavities, dielectric layers, conductors, etc. Various steps of method 800 may repeated so that multiple interconnection layers 39-N (N=1, 2, 3, . . . etc.) can be built up, stacked one upon the other, wherein the index N is incremented for each repetition, keeping in mind that conductor $M_{N+1}$ of a lower or underlying interconnection 39-(N=i) can serve as conductor $M_N$ of the next higher or overlying interconnection 39-(N=i+1).

Referring now to FIG. 18, method 800 begins with START 801 and initial step 802 wherein there is supplied a substrate (e.g., substrate 40) having thereon an $N^{th}$ dielectric (e.g., dielectric layer 50 and region 27) in or on which it is desired to form a multi-layer interconnection (e.g., interconnection 39-N) having lower conductor $M_N$ (e.g., conductor 22, 23), upper conductor $M_{N+1}$ (e.g., conductor 34, 35) and interconnecting via $V_{N+1/N}$ (e.g., conductive via 36, 36'). In general, some or all of the active devices making up the IC of which the multi-level interconnection (e.g., 39-N) is a part will generally but not essentially already have been formed in substrate (e.g., 40) using means well known in the art. In discussing FIGS. 18-19, it will be understood that any number of lower conductors $M_N$ (e.g., 22, 23) may be formed together, and any number of upper conductors $M_{N+1}$ (e.g., 34, 35) may be formed together, and that some of the upper conductors (e.g. 34) that overlie lower conductors (e.g., 22) will be coupled via the interconnecting vias $V_{N+1/N}$ (e.g., 36, 36'), whereas other upper (e.g., 35) and lower conductors (e.g., 23) are not coupled by such vias. Accordingly, that is reflected in the reference numbers included by way of example and not limitation.

In step 804, the lower conductor $M_N$ (e.g., conductor 22, 23) is formed on the substrate (e.g. 40) with an upper surface (e.g., surface 61) of the lower conductor $M_N$ (e.g., 22, 23) recessed below an upper surface (e.g. surface 56) of the $N^{th}$ dielectric (e.g., layer 50 and region 27).

In step 806, an $(N+1)^{th}$ insulating layer (e.g., layer 68 of FIGS. 15-17, formed from some or all of layers 58, 25, 70, 72 shown in FIGS. 9-10 and following) is provided above the $N^{th}$ dielectric (e.g., layer 50) and the upper surface (e.g., surface 61) of the lower conductor $M_N$ (e.g., 22, 23).

In step 808, an $(N+1)^{th}$ cavity (e.g., cavity 1263) is etched through the $(N+1)^{th}$ insulating layer (e.g., layer 68) from a desired location (e.g., mask opening 122) of the upper conductor $M_{N+1}$ (e.g., conductor 34) and exposing the upper surface (e.g., surface 61) of the lower conductor $M_N$ (e.g., 22).

In step 810, the $(N+1)^{th}$ cavity (e.g., cavity 1263) is filled with an electrical conductor (e.g., conductor 80) adapted to form the upper conductor $M_{NA}$ (e.g., conductor 34) and the connecting via $V_{N+1/N}$ (e.g., conductive via 36, 36'), and make electrical contact with the upper surface (e.g., 61) of the lower conductor $M_N$ (e.g., 22).

In query step 812, it is determined whether or not the multilevel interconnection stack (e.g., 39-1, 39-2, ... 39-Q, where N=Q) is complete, or stated another way, whether the desired number (e.g., N=Q) of two-layer interconnections 39-N have been formed one on top of the other, and with the appropriate conductive leads $M_N$, $M_{N+1}$ on each layer, and layer-to-layer interconnective via conductors $V_{N+1/N}$ formed where desired between successive conductor layers. If the outcome of query 812 is "NO" and N≤Q−1, then method 800 desirably advances via path 813-1 to step 816 wherein conductor material (e.g., conductor 80) in the $(N+1)^{th}$ cavity (e.g., cavity 1263) is removed to lower an upper surface (e.g., surface 81', 84 of FIG. 17) of the upper conductor $M_{N+1}$ (conductor 34, 35) below an upper surface (e.g. surface 74) of the $(N+1)^{th}$ dielectric (e.g., layer 68 of FIG. 17). This is done so that the upper conductor $M_{N+1}$ (e.g., conductor 34, 35) of the interconnection just completed (e.g., for N=i) can serve without further modification as the lower conductor $M_N$ of a next overlying interconnection level (e.g., where N has been indexed to N=i+1). In this way the feature of having the lower conductor $M_N$ in each interconnection level 39 recessed, for example in the equivalent of portion 62 of layer 50 of FIG. 3, so that increased critical distances (e.g., distances 32, 37) are obtained between an adjacent lower conductor $M_N$ and the connecting $V_{N+1/N}$ via being formed between the conductor levels, can propagate through every level of the multilevel interconnection stack, if desired. Following removing step 818 up to N=Q−1, method 800 then follows path 817 from step 816 to incrementing step 818. If N=Q, removing query 818 is not necessary although may be included in other embodiments, and method 800 can proceed directly from step 812 via path 813-2 to incrementing step 818 and then to a final repetition of providing, etching and filling steps 806, 80-8, 810 and query 812 whose outcome is then YES, leading to END 820. While removing step 816 is desirable before repetition of providing, etching and filling steps 806, 808, 810 at any stage of forming a stack of interconnection layers, persons of skill in the art will understand that it is not necessary if separation 31 (see FIG. 2) between others of lower conductor $M_N$ (e.g., conductor 23) and via conductor $V_{N+1/N}$ (e.g., 26, 26') for N=j (where j may take on any value referring to any interconnection level in the stack) does not fall below a critical dimension value $CD_j$. This can occur, for example, where $M_N$ conductor to conductor spacing 32 of FIG. 2 is not limited for N=j to the minimal layout dimension, but is larger. The magnitude of $CD_j$ depends upon the particular process being used. In this situation, the improvement in CD 37 provided by the implementation illustrated in FIG. 3 may not be needed and step 816 may be omitted for such interconnection levels 39-j and method 800 can proceed to increment step 818 via path 813-2. Either arrangement is useful.

In step 818, index N is incremented so that when method 800 proceeds via path 819 to repeat steps 806-810 the index N=i used during just completed step 812 or 816 is set to N=i+1 in step 818, and each time step 818 is repeated for as many of steps 806-810 (and 816 if used) as are needed are repeated until N=Q, whereupon the outcome of query 812 is YES and method 800 proceeds to END 820. It should be noted that that the desired sizes and lateral locations and spacing of lower conductor $M_N$, upper conductor $M_{N+1}$ and via conductors $V_{N+1/N}$ may be different for each iteration of N=1, 2, 3, ... Q.

FIG. 19 illustrates further details with respect to step 804 of method 800 illustrated in FIG. 18. Referring now to FIG. 19, in step 804-1, at least an $N^{th}$ dielectric (e.g., dielectric 50) is formed on the substrate (e.g. substrate 40). In step 804-2, an Nth cavity (e.g., cavity 105, 106) is etched at least through the $N^{th}$ dielectric (e.g., dielectric 50), corresponding to the desired location (e.g., 101, 102) of the lower conductor $M_N$ (e.g., conductor 22, 23) and the lower portion (e.g., 362) of eventual via $V_{N+1/N}$ (e.g., 36, 36'). In step 804-3, the $N^{th}$ cavity (e.g., cavity 105, 106) is filled with an electrical conductor (e.g., conductor 60) adapted to serve as the lower conductor $M_N$ (e.g., conductor 22, 23). In step 804-4, conductive material (e.g., conductor 60) in the $N^{th}$ cavity (e.g., cavity 105, 106) is removed to lower an upper surface (e.g., surface 61) of the lower conductor $M_N$ (e.g., conductor 22, 23) below an upper surface (e.g. surface 56) of the $N^{th}$ dielectric (e.g., dielectric 50) within a recess portion (e.g., portion 62) of the $N^{th}$ dielectric (e.g., dielectric 50) around the $N^{th}$ cavity (e.g., cavity 105, 106). The lower portion (e.g., portion 362) of via $V_{N+1/N}$ will eventually be formed in the recess portion (e.g., 62). Method 800 then proceeds to step 806.

By repeating the appropriate portions of method 800, e.g., N=Q times, as described above, then Q multi-layer interconnections 39-Q can be stacked to form an IC with multiple interconnection levels of any desired complexity, where Q can have any value. When this is done as illustrated in the foregoing embodiments, self-aligned via connection regions 362, of via $V_{N+1/N}$ conductor 36, 36' in recess portions 62 of dielectric layer 50 above lower $M_N$ conductor 22, 23 provide critical dimensions 32, 37 that are significantly larger than critical dimension 31 of the prior art (e.g., compare FIGS. 2-3), with no increase in overall circuit area. This improvement in critical dimensions 32, 37 can be provided in every level of the multiplayer interconnections 39-1 . . . 39-Q. The improvements in critical dimensions provided by method 800 apply to the random alignment variations encountered during manufacturing as well as to situations where interconnection-level-to-interconnection-level alignment may be substantially perfect. This is a significant advance in the art of ICs employing multi-level interconnections, and is especially valuable as further shrinkage of IC design rules and increase in IC complexity is sought.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described and methods of preparation in an exemplary embodiment without departing from the scope of the invention as set forth in the appended claims and their legal equivalents.

What is claimed is:

1. A method for forming an integrated circuit (IC) having a multilayer interconnect structure, comprising:
   supplying a substrate having thereon an $N^{th}$ dielectric, in or on which it is desired to form a multi-layer interconnection having lower conductor $M_N$, upper conductor $M_{N+1}$ and interconnecting via $V_{N+1/N}$;
   forming the lower conductor $M_N$ on the substrate with an upper surface of the lower conductor $M_N$ recessed below an upper surface of the $N^{th}$ dielectric;
   providing an $(N+1)^{th}$ dielectric above the $N^{th}$ dielectric and the upper surface of the lower conductor $M_N$;
   etching an $(N+1)^{th}$ cavity through the $(N+1)^{th}$ dielectric from a desired location of the upper conductor $M_{N+1}$ and exposing the upper surface of the lower conductor $M_N$;
   filling the $(N+1)^{th}$ cavity with an electrical conductor adapted to form the upper conductor $M_{N+1}$ and the connecting via $V_{N+1/N}$, and make electrical contact with the upper surface of the lower conductor $M_N$; and
   determining whether or not a desired multilevel interconnection stack having N=Q total interconnection levels is complete, and if not:
   optionally removing conductor material in the $(N+1)^{th}$ cavity to lower an upper surface of the upper conductor $M_{N+1}$ below an upper surface of the $(N+1)^{th}$ dielectric; and then
   incrementing N by one and repeating providing, etching, filling, querying, and removing for any or all desired successive interconnection level N up to N=Q−1.

2. The method of claim 1, further comprising, after N=Q−1, incrementing N by one and repeating at least providing, etching, and filling for interconnection level N=Q.

3. The method of claim 1, wherein removing conductor material in the $(N+1)^{th}$ cavity to lower an upper surface of the upper conductor $M_{N+1}$ below an upper surface of the $(N+1)^{th}$ dielectric is accomplished by chemical-mechanical-polishing (CMP).

4. The method of claim 1, wherein removing conductor material in the $(N+1)^{th}$ cavity to lower an upper surface of the upper conductor $M_{N+1}$ below an upper surface of the $(N+1)^{th}$ dielectric is accomplished by etching an exposed surface of the upper conductor $M_{N+1}$.

5. The method of claim 1, wherein removing conductor material in the $(N+1)^{th}$ cavity to lower an upper surface of the upper conductor $M_{N+1}$ below an upper surface of the $(N+1)^{th}$ dielectric is accomplished by converting conductive material near an exposed upper surface of the upper conductor $M_{N+1}$ to an oxide of the conductive material and then removing the oxide by etching.

6. The method of claim 1, wherein forming the lower conductor $M_N$ comprises:
   forming at least an $N^{th}$ dielectric on the substrate;
   etching an $N^{th}$ cavity at least through the $N^{th}$ dielectric, corresponding to the desired location of the lower conductor $M_N$;
   filling the $N^{th}$ cavity with electrically conductive material adapted to serve as the lower conductor $M_N$; and
   removing conductive material in the $N^{th}$ cavity to lower an upper surface of the lower conductor $M_N$ below an upper surface of the $N^{th}$ dielectric within a recess portion of the $N^{th}$ dielectric around the $N^{th}$ cavity.

7. The method of claim 6, wherein removing conductive material in the $N^{th}$ cavity to lower an upper surface of the lower conductor $M_N$ below an upper surface of the $N^{th}$ dielectric within a recess portion of the $N^{th}$ dielectric around the $N^{th}$ cavity is accomplished by chemical-mechanical-polishing (CMP).

8. The method of claim 1, wherein removing conductive material in the $N^{th}$ cavity to lower an upper surface of the lower conductor $M_N$ below an upper surface of the $N^{th}$ dielectric within a recess portion of the $N^{th}$ dielectric around the $N^{th}$ cavity is accomplished by etching an exposed surface of the upper conductor $M_{N+1}$.

9. The method of claim 1, wherein removing conductive material in the $N^{th}$ cavity to lower an upper surface of the lower conductor $M_N$ below an upper surface of the $N^{th}$ dielectric within a recess portion of the $N^{th}$ dielectric around the $N^{th}$ cavity is accomplished by converting conductive material near an exposed upper surface of the lower conductor $M_N$ to an oxide of the conductive material and then removing the oxide by etching.

10. A method for forming a multi-layer interconnection, comprising:
   providing a substrate having thereon a first dielectric for supporting the multi-layer interconnection, wherein the multi-layer interconnection has a lower conductor $M_N$, upper conductor $M_{N+1}$, an interlayer dielectric and interconnecting via conductor $V_{N+1/N}$;
   wherein the lower conductor $M_N$ has a first upper surface located in a recess below a second upper surface of the first dielectric;
   forming the interlayer dielectric above the first and second surfaces;
   etching a cavity through the interlayer dielectric from a desired location of the upper conductor $M_{N+1}$ and exposing the first surface in the recess; and
   filling the cavity with an electrical conductor to form the upper conductor $M_{N+1}$ and the connecting via conductor $V_{N+1/N}$ making electrical contact between a first of upper conductor $M_{N+1}$ and the first upper surface in the recess; and removing excess electrical conductor overlying the interlayer dielectric, thereby electrically separating the first and a second of upper conductor $M_{N+1}$.

11. The method of claim 10, further comprising, recessing an upper surfaces of the first and the second of upper conductor $M_{N+1}$ below an upper surface of the interlayer dielectric.

12. The method of claim 11, wherein recessing is performed by oxidation and oxide etching of the electrical conductor.

* * * * *